(12) United States Patent  
Deangelis et al.

(10) Patent No.: US 7,208,960 B1  
(45) Date of Patent: Apr. 24, 2007

(54) PRINTED CAPACITIVE SENSOR

(75) Inventors: Alfred R. Deangelis, Spartanburg, SC (US); D. Bruce Wilson, Buffalo, SC (US); Brian A. Mazzeo, Davie, FL (US)

(73) Assignee: Milliken & Company, Spartanburg, SC (US)

( * ) Notice: Subject to any disclaimer, the term of this patent is extended or adjusted under 35 U.S.C. 154(b) by 0 days.

(21) Appl. No.: 11/352,107

(22) Filed: Feb. 10, 2006

(51) Int. Cl.  
*G01R 27/26* (2006.01)

(52) U.S. Cl. ........................... 324/661; 324/662

(58) Field of Classification Search ................ 324/690, 324/661, 686, 662  
See application file for complete search history.

(56) References Cited

U.S. PATENT DOCUMENTS

| | | | |
|---|---|---|---|
| 4,016,490 A | 4/1977 | Weckenmann et al. | 324/671 |
| 4,703,757 A | 11/1987 | Cohen | 600/480 |
| 5,033,291 A | 7/1991 | Podoloff et al. | 73/172 |
| 5,060,527 A | 10/1991 | Burgess | 73/862.68 |
| 5,449,002 A | 9/1995 | Goldman | 600/592 |
| 5,608,599 A | 3/1997 | Goldman | 361/283.1 |
| 5,622,123 A | 4/1997 | Rajamannan | 111/120 |
| 5,775,332 A | 7/1998 | Goldman | 600/587 |
| 5,878,620 A | 3/1999 | Gilbert et al. | 73/172 |
| 5,917,180 A | 6/1999 | Reimer et al. | 250/227.14 |
| 5,923,522 A | 7/1999 | Sajna | 361/288 |
| 6,033,370 A | 3/2000 | Reinbold et al. | 600/595 |
| 6,210,771 B1 | 4/2001 | Post et al. | 428/100 |
| 6,333,736 B1 | 12/2001 | Sandbach | 345/178 |
| 6,431,005 B1 * | 8/2002 | Delaye | 73/724 |
| 6,519,137 B1 | 2/2003 | Nitta et al. | 361/525 |
| 6,585,162 B2 | 7/2003 | Sandbach et al. | 235/462.44 |
| 6,646,452 B2 | 11/2003 | Lester | 324/661 |
| 6,714,117 B2 * | 3/2004 | Sandbach | 338/101 |
| 6,807,689 B1 | 10/2004 | Royko et al. | 4/541.1 |
| 2003/0217582 A1 | 11/2003 | Reinbold, et al. | 73/12.09 |
| 2006/0131159 A1 | 6/2006 | Kaps | 200/600 |
| 2006/0198080 A1 | 9/2006 | Hawes et al. | 361/311 |

* cited by examiner

*Primary Examiner*—Andrew H. Hirshfeld  
*Assistant Examiner*—Amy He  
(74) *Attorney, Agent, or Firm*—Terry T. Moyer; Cheryl J. Brickey

(57) ABSTRACT

The invention relates to a flexible, resilient capacitive sensor suitable for large-scale manufacturing. The sensor comprises a dielectric, an electrically conductive detector and trace layer on the first side of the dielectric layer comprising a detector and trace, an electrically conductive reference layer on a second side of the dielectric layer, and a capacitance meter electrically connected to the trace and to the conductive reference layer to detect changes in capacitance upon interaction with detector. The sensor is shielded to reduce the effects of outside interference.

9 Claims, 3 Drawing Sheets

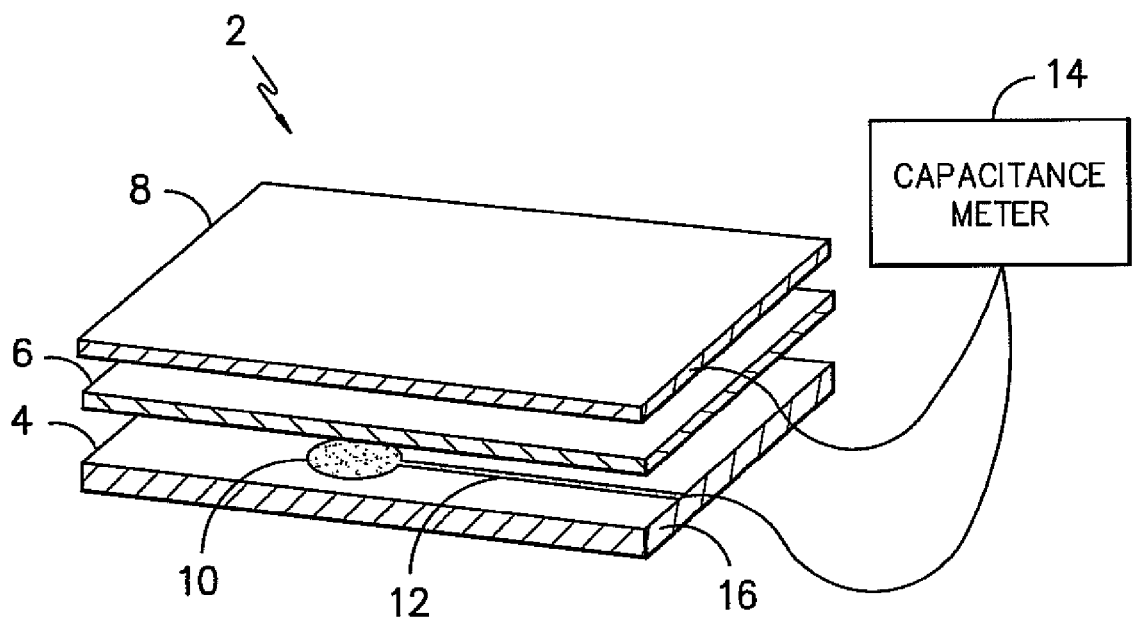
FIG. -1-
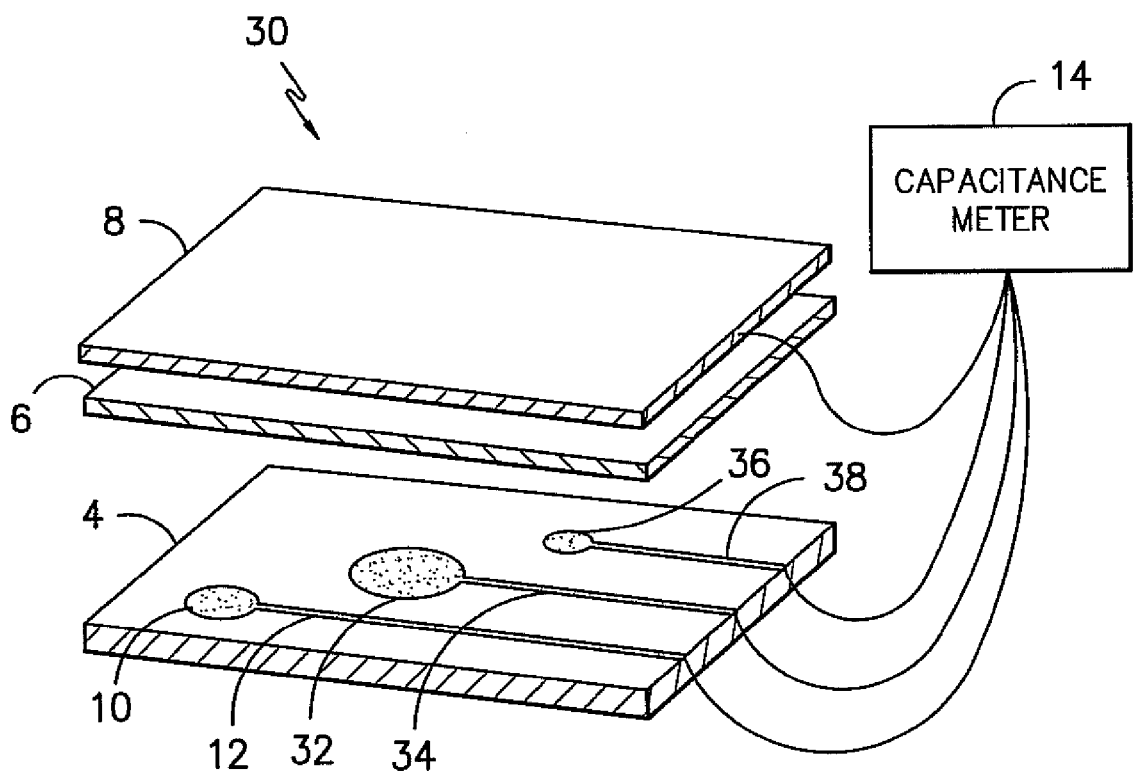
FIG. -2-

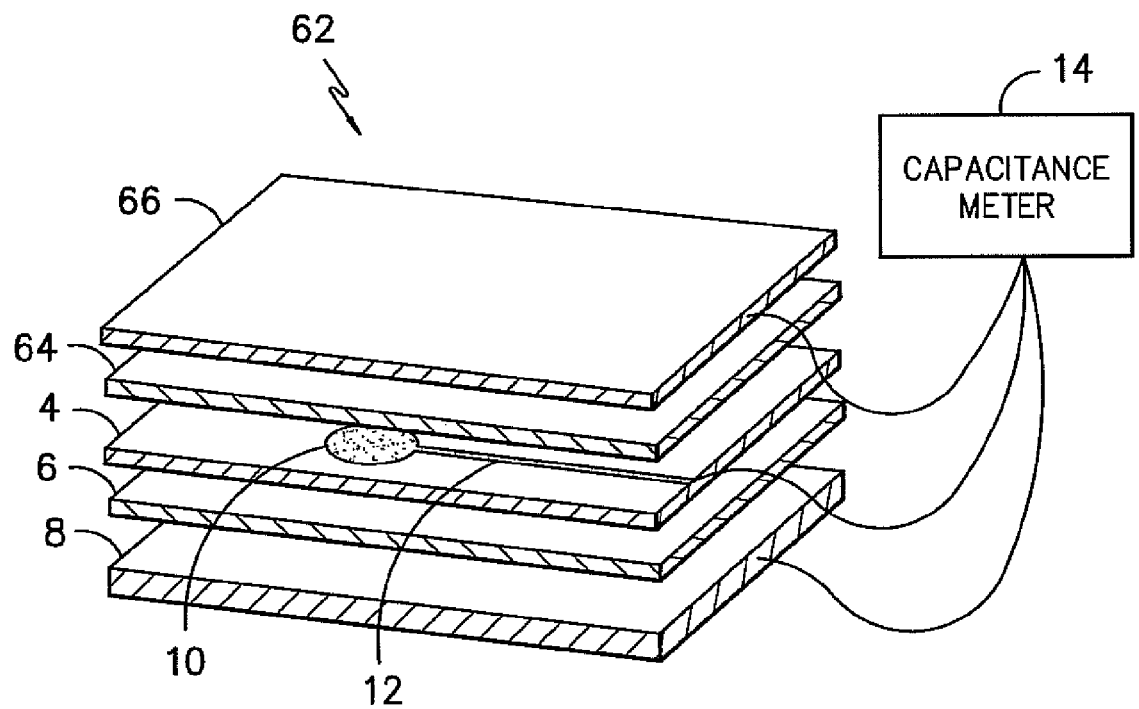
FIG. −3−
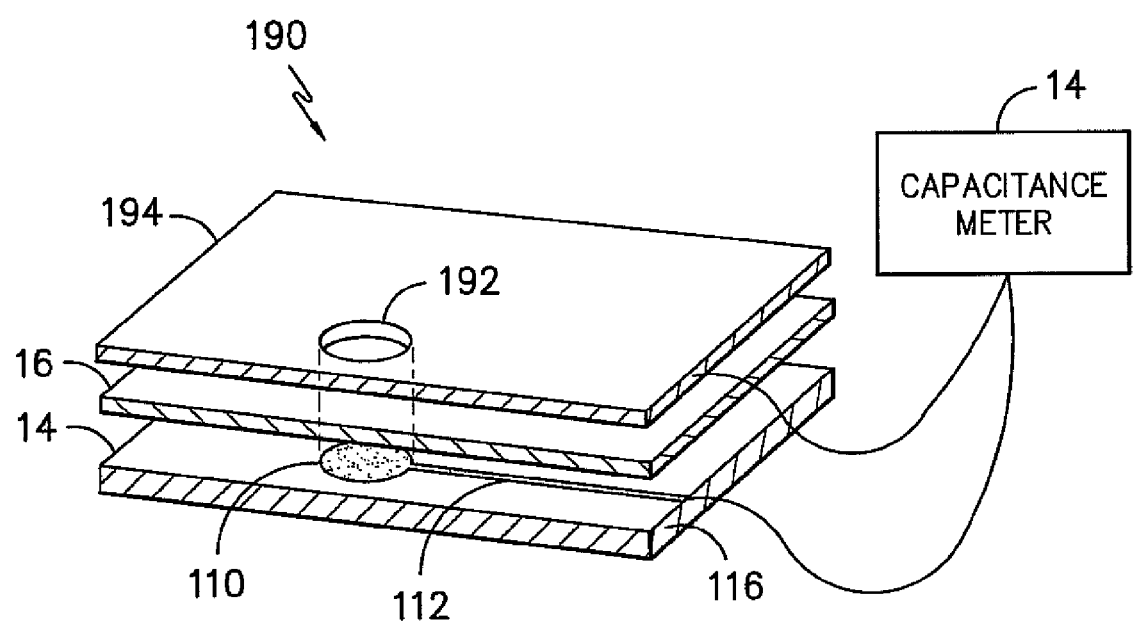
FIG. −4−

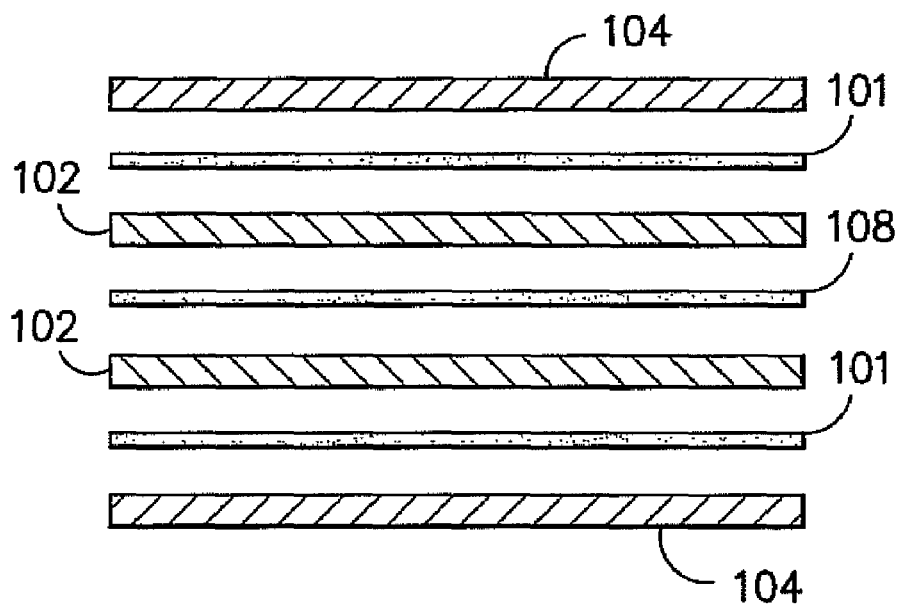
FIG. -5-
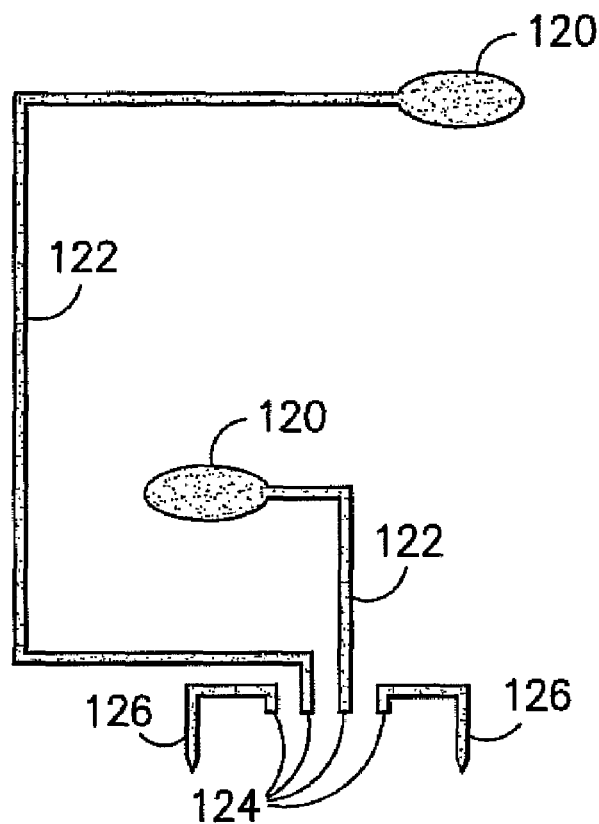
FIG. -6-

PRINTED CAPACITIVE SENSOR

TECHNICAL FIELD

This invention relates to a flexible capacitive sensor. More particularly, the invention relates to a capacitive sensor suitable for large-scale manufacturing, that is both physically flexible and flexible in its applications, and that senses incremental changes in pressure based on the changes in the capacitance of the sensor.

BACKGROUND

Sensors, as the term is used here, refer to systems that react to a change in the environment. Pressure sensors react to an applied force or pressure using a variety of physical principles. Optical sensors change their optical properties under applied force. Similarly, electrically resistive, or simply resistive, sensors have an electrical resistance that changes under applied force. Piezoresistive sensors measure the change in electrical resistance of a piezoresistive material as pressure is applied.

Capacitive sensors change capacitance. This can be in response to an applied force; it can also be in response to the proximity of an object with relatively large capacitance, such as a person. Capacitive sensors can also use a combination of resistive and capacitive sensing, in which the electrical resistance is measured when the capacitance changes.

Capacitive sensors are known and are used, for example, in touch screens and elevator buttons. The change in capacitance is typically based on one of two principles. The first approach involves changing the capacitance monitored by the sensing system through direct electrical contact with a large capacitive object, usually a person through their finger. In certain cases this type of sensor may also function to detect the proximity of an object to the touch sensor, not requiring physical contact with the touch sensor. These systems often require direct contact between the person and the sensing system and may not work, if for example the person is wearing a glove. Additionally, capacitive coupling may not be well suited to quantitatively measuring the applied pressure or proximity, but are capable of binary (on/off) sensing.

Another approach uses two conductive planes separated by a compressible, resilient dielectric. This composite forms a capacitor whose capacitance depends in part on the distance between the conductive planes. The compression of the dielectric under pressure changes the capacitance between the planes, which can be detected by the sensing system. By calibrating the compression with the applied force or pressure, this system can be used to quantify the force or pressure of the interaction with the sensor.

In recent years, there has growing interest in so-called "smart fabrics" that give electronic devices physical flexibility. They allow an electronic device to be incorporated into an existing fabric rather than have a separate electronic device. An example of a smart fabric is a computer keyboard that can be rolled up when not in use.

Flexible sensors are needed for smart fabrics and other applications that require flexibility. Flexible optical pressure sensors have been described, for example, in U.S. Pat. No. 4,703,757 and U.S. Pat. No. 5,917,180. Flexible sensors based on electrical contact of two or more conducting planes are available from Eleksen Ltd. of Iver Heath, United Kingdom. Flexible pressure sensors that use principles of piezoreistance are available from, Softswitch Ltd. of likely, United Kingdom. A flexible capacitive sensor based on the capacitance of the human body is described in U.S. Pat. No. 6,210,771. A flexible capacitive sensor that uses the change in spacing between conductive planes is described in a series of US patents to Goldman, et al, including U.S. Pat. No. 5,449,002. These patents teach the use of flexible conductive and dielectric layers, but they do not teach a system which can be used to determine location, nor do they teach systems with multiple sensors (beyond the simple case of replications of a single sensor).

Thus there remains a need for a large-area flexible capacitive pressure sensor with good spatial resolution, capable of quantifying applied pressure or force. Here we address those issues by describing multiple methods of constructing a flexible capacitive sensing system with multiple sensors that detects the presence of an applied force or pressure and is capable of determining the magnitude and location of the applied force or pressure. All patent documents referenced in this specification are hereby specifically incorporated by reference in their entirety as if fully set forth herein.

SUMMARY OF THE INVENTION

The present invention overcomes many of the deficiencies of capacitive touch sensors. The present invention provides an inexpensive, light weight, flexible, capacitive sensor and an efficient, low cost method of manufacturing.

According to its major aspects and briefly recited, the present invention is a capacitive sensor suitable for large-scale manufacturing, that is both physically flexible and flexible in its applications, and that senses incremental pressure based on the changes in the capacitance of the sensor.

An important advantage of the present invention is the way the components, namely, the detector-and-trace layer, dielectric layer, conductive reference layer and penetration connector can be assembled to form the present capacitive sensor in a large-scale manufacturing process. Coating, gluing, and screen printing operations can be easily automated. Such operations can make a very large capacitive sensor array or a large fabric from which individual sensors or sensor arrays can be cut.

Another important feature of the present invention is compatibility with the use of penetration connectors for quickly and easily connecting traces and the reference layer to a capacitance meter (an electrical measurement system) so that electrical signals can be applied or measured from the present sensor without the need for customized electrical connections.

Still another feature of the present invention is the use of capacitance rather than resistance for sensing contact. Resistance typically requires the two conductive surfaces to touch; capacitance, in some embodiments not only does not require touching but does not even require physical contact with the sensor in some embodiments of the present invention, but mere proximity of a button with the user's finger. Capacitance may also be used to measure the pressure of contact and not just the fact of contact.

These and other features and their advantages will be apparent to those skilled in the art of electrical circuits and capacitive circuits from a careful reading of the Detailed Description of Preferred Embodiments accompanied by the following drawings.

BRIEF DESCRIPTION OF THE DRAWINGS

The accompanying drawings which are incorporated in and which constitute a part of this specification illustrate several exemplary constructions- and procedures in accordance with the present invention and, together with the general description of the invention given above and the detailed description set forth below, serve to explain the principles of the invention wherein:

FIG. 1 is an illustrational schematic view of a capacitive sensor with a electrically conductive reference layer, a flexible, resilient dielectric layer and a detector and trace layer, all connected to a capacitance meter.

FIG. 2 is an illustrational schematic view of a capacitive sensor with more than one trace and more than one detector.

FIG. 3 is an illustrational schematic view of a capacitive sensor with an additional dielectric layer and conductive reference layer.

FIG. 4 is an illustrational schematic view of a capacitive sensor with holes in the electrically conductive reference layer that overlap the detectors in the detector and trace layer.

FIG. 5 is a schematic cross-section of a capacitive sensor with additional dielectric and conductive reference layers as shown in FIG. 3, additionally with optional outer layers.

FIG. 6 is an illustrative conductive pattern that could be used on the conductive layer, showing detectors, traces, and reference layer connections.

To the extent possible, like elements are designated by like reference numbers throughout the various views.

DETAILED DESCRIPTION OF THE INVENTION

FIG. 1 shows one embodiment of the capacitive pressure sensor of the invention. The flexible capacitive sensor 2 has a dielectric layer 6 with a conductive reference layer 8 on one side and a detector and trace layer 4 on the other side of the dielectric layer 6. The conductive reference layer 8 and the trace(s) 12 of the detector and trace layer 4 are connected to a capacitance meter 14.

The flexible capacitive sensor 2 experiences a change in capacitance upon the application of force sufficient to compress the sensor. The amount of applied force, up to a point, is related to the extent of the change in capacitance. In an alternate embodiment, the resistance is also measured to determine the location of user interaction on the sensor. A capacitance meter 14 monitors the present flexible capacitive sensor to determine whether there has been a change in capacitance and the extent of that change.

The dielectric layer 6 is a flexible, resilient layer or film. "Flexible", as related to this invention, is defined to mean pliable and capable of being substantially bent through its thinnest dimension and returning to a flat configuration. Preferably, each layer in the sensor is flexible. "Resilient" is defined to mean a material that essentially returns to its initial thickness after each of multiple compressions, either over a portion of the material or its entirety. Dielectric, in this application, means a material that does not allow current to flow and supports an electric field even under the presence of a potential difference. A "film" or "foam" is defined to be a flexible material that is essentially two dimensional in extent, that is, having a thickness in one dimension that is significantly smaller than its length or width. Foams include void spaces in a significant portion of their interior and are thus usually highly compressible. Films are defined to have few or no void spaces.

The resilience of the dielectric layer 6 is important for repeated use and durability and the flexibility is important so that the sensor may be used in applications that require flexibility, such as fitting around a molded dashboard, or on clothing as part of a smart fabric. Preferably, dielectric layer 6 is capable of bending to a radius of curvature ranging from 20 millimeters (mm) to 5 mm, preferably to a range of 10 mm to 4 mm, and more preferably to a range of 5 mm to 1 mm.

In one embodiment of the invention, the dielectric layer is a thin, flexible, resilient film that has a thickness of less than 250 micrometers, preferably between 8 and 250 micrometers, and for some applications, between 8 and 50 micrometers. This thin film is essentially free of voids (which can be filled with air or another gas), meaning that the film does not contain foam. The thin film may be a silicone film, such as 7 mil (approximately 175 micrometers) thick Duraflex PT9300 film available from Deerfield Urethane of South Deerfield, Mass. Compressibility enables the capacitance of sensor to be altered by an applied force. The dielectric thin film preferably compresses by 50% when a load of between 50 and 150 bars is applied. This range enables an acceptable signal to be read by the capacitance meter.

In another embodiment, the dielectric layer 6 may be a flexible, resilient, and highly compressible closed or open cell foam. Some foamed materials include, but are not limited to, polyurethane foams, silicone, and rubber. The dielectric foam preferably compresses by 50% when a load of between 0.5 and 1.0 bars is applied.

In another embodiment of the invention, the dielectric layer is a flexible, resilient spacer fabric. "Spacer fabric" as defined in this application is a fabric that has upper and lower ground layers separated by a gap that is supported by spacing yarns or fibers. The spacer fabric or other layers of fabric in the construction can be a woven, knitted, nonwoven material, tufted materials, or the like. In some embodiments, the spacer fabrics is a double-needlebar knit, needled nonwoven fabric, or a hi-loft nonwoven fabric in which some of the fibers are purposefully oriented in the vertical direction. The textile may be flat, or may exhibit a pile. In some embodiments, the spacer fabric can have a thickness of between 1 mm and 10 cm, preferably between 1 mm and 1 cm. Such textile materials can be formed of natural or synthetic fibers, such as polyester, nylon, wool, cotton, silk, polypropylene, rayon, lyocell, poly(lactide), acrylic, and the like, including textile materials containing mixtures and combinations of such natural and synthetic fibers. The spacer fabric preferably compresses by 50% when a load of between 0.07 and 1.4 bar is applied and compresses between 10 and 50% when a 0.14 bar load is applied. These ranges enable an acceptable signal to be read by the capacitance meter.

The electrical resistance across the dielectric layer 6 (from one side of dielectric layer 6 to its opposing side) is preferably $10^9$ ohms or greater. The greater the dielectric constant of the dielectric layer, the greater the capacitance of capacitive pressure sensor 2. This may allow the sensor to discriminate smaller signals, hence smaller applied forces, making the system more sensitive.

The detector and trace layer 4 has one or more detectors 10 and traces 12 and is flexible. Detectors 10 are local areas of conductive material and traces 12 are continuous lines (that may be straight or curved) of conductive material running from detectors 10 to an edge 16 of the detector and trace layer 4. Each detector 10 is preferably electrically connected to a separate trace 12 and electrically isolated from other detectors and traces. Detectors 10 may also be referred to as buttons.

In some embodiments, there is more than one detector 10 and more than one trace 12. Preferably, each detector has its own trace and the detector and trace are electrically isolated from other detectors and traces, shown for example in FIG. 2. In FIG. 2, the detector and trace layer 4 is separated from the dielectric layer 6 such that the detector and trace configuration may be seen. Detectors 10, 32, and 36 are connected to traces 12, 34, and 38 respectively. Connections to the capacitance meter can be made through a penetration connector (not shown) with separate pins for each trace, and other than through the capacitance meter none of the detector/trace pairs are electrically connected to any other detector/trace pair.

Preferably, the conductivity measured from the center of detector 10 to the point where trace 12 reaches edge 16 of detector and trace layer 4 is one megaohm or less, and more preferably between 0 and 10,000 ohms. However, it is sufficient that the electrical resistance of detector 10 to the end of trace 12 be less than the electrical resistance across dielectric layer 6.

The detector and trace layer 4 may be formed by applying conductive coatings to the dielectric layer 6 or a separate layer. The separate layer may be a fabric or film that is then applied to dielectric layer 6 by laminating in any manner known to those skilled in the art. Preferably, an adhesive is used between the layers including reactive urethane adhesives or low-melt polymeric materials. Adhesives can be applied for example by rotogravure printing, knife coating, powder application, or as a web, depending on the form of the adhesive.

In one embodiment of the invention, detectors 10 and traces 12 are screen printed directly onto the dielectric layer 6 or on a film or fabric adhered to dielectric layer 6. The ink may be any conductive ink which is typically formed by blending resins or adhesives with powdered conductive materials such as, gold, silver, copper, graphite powder, carbon black, nickel or other metals or alloys. They may also be carbon-based ink, silver-based ink, or a combination of carbon-based and silver-based inks. The conductive ink may be coated on the substrate using any of a variety of methods known in the art, including but not limited to, screen printing, applying by brush, applying by roller, spraying, dipping, masking, vacuum plating, vacuum deposition or any combination of the foregoing.

The electrically conductive reference layer 8 of the flexible capacitive sensor 2 may be a conductive coating on the dielectric layer 6, an inherently conductive film or fabric, or an electrically conductive coating on a film or fabric which is then adhered to the dielectric layer 6. In some configurations the electrically conductive reference layer is preferably continuous. In others, it may have openings in the layer if desired. Preferably, the reference layer is flexible.

In one embodiment, the electrically conductive reference layer 8 is an electrically conductive coating onto the dielectric layer. This enables the sensor to be thinner and weigh less, important for portable applications and may also simplify assembly or reduce cost. The materials disclosed for the detector 10 and trace 12 may be also used for the conductive reference layer 8. In another embodiment, the electrically conductive reference layer 8 is an inherently conductive film or fabric. Some inherently conductive films and fabrics include, for example, metallized fabrics, carbon-loaded olefin films, fabrics coated with conductive polymers, fabrics constructed from flexible, conductive yarns such as stainless steel yarns, and silver-coated yarns. In another embodiment, the electrically conductive reference layer 8 may be a film or fabric with an electrically conductive coating. Preferably, the film or fabric is adhered to dielectric layer 6 preferably using a thermoplastic, thermoset, pressure sensitive or UV curable adhesive.

The electrical resistance of the conductive reference layer 8 is typically less than less than 10,000 ohms. If the capacitive sensor 2 is not being used to determine the position of the user interaction, then the electrical resistance of the conductive reference layer may be as low as practical.

Additionally, the electrically conductive reference layer 8 can be patterned with additional detectors and traces (not shown) placed in registration with detectors 10 and traces 12 of the detector and trace layer 4, rather than be a continuous layer. However, this approach does introduce an additional manufacturing complication to position the conductive reference layer 8 such that its detectors 10 and traces 12 are registered with the pattern of detectors and traces in the detector and trace layer 4.

In one embodiment, shown in FIG. 4, the electrically conductive reference layer 194 has a hole 192 in the layer that at least partially overlaps the detector 110 in the detector and trace layer 104. Preferably, the hole 192 completely overlaps and is in alignment with the detector 110. There may be 2 or more detectors and 2 or more holes, with each hole overlapping a detector.

In this configuration, the electric field lines of the capacitive sensor occupy the space above the detector 110 and below the hole 192. They are easily perturbed by an external capacitive object, such as a person's finger, that approaches or enters the hole 192. This perturbation will change the capacitance sensed by the capacitive sensor and can be detected as an event. The perturbation is caused even though the capacitive object does not come into electrical contact with the detector 110. The conductive reference layer 194 of the present invention shields the detector and trace layer 104 from the external capacitive object. A hole in the conductive reference layer 194 overlapping the detector 110 concentrates the field lines in the area above the detector making the system more sensitive to events occurring at the detector 110 and less prone to false indications due to peripheral approach to the detector. Additionally, a capacitive sensor that does not include a conductive reference layer will be more susceptible to interference from external electromagnetic fields, stray capacitance, static electricity, and to false events due to contact of the external capacitive object with the trace.

The dielectric layer 106 in the capacitive sensor 190 shown in FIG. 4 does not need to be compressive or resilient, since a change in capacitance can be caused by the proximity of a capacitive body, as opposed to a change in the distance between detector 110 and reference layer 194. The dielectric layer 6 can be any suitably thin, flexible, electrically resistive material.

FIG. 3 shows a capacitive sensor 62 with an additional flexible dielectric layer 64 and conductive reference layer 66. The second flexible, resilient dielectric layer 64 is on the detector and trace layer 4 on the side opposite the original dielectric layer 6. There is a second electrically conductive reference layer 66 adjacent to the second dielectric layer 64 on the side opposite the detector and trace layer 4. The materials used for the second flexible, resilient, dielectric layer and the second electrically conductive reference layer may be the same materials and have the same physical properties as the dielectric layer and conductive reference layer described previously.

Other layers may be applied to the sensor such as an insulating layer and are preferably flexible. An insulating layer may be coated, laminated, stitched, or otherwise applied to either or both of exterior surfaces of the capacitive sensor 2, 30, 62, or 190. These layers may be constructed of any materials and in any manner such that the overall flexibility of the sensor remains acceptable. Usually these materials will retain the thin profile that is typical of the capacitive sensors of the invention. Possible materials for the exterior layers include textiles, leather or other hides, films, or coatings. The insulating layers may each be a composite of multiple materials and layers, and the top and bottom insulating layers need not be of the same make-up.

Decorative graphics or information, e.g., information about, or instructions for, touch sensor or the display or other device to which touch sensor is applied or connected, may be printed on an outermost insulating layer on the sensor. Typically the top surface of the sensor, the surface presented to the user, will include graphics to indicate the location and function of each of the detectors. The material can be chosen to provide both decorative and functional aspects. Functions of the insulating layer may include visual or tactile aesthetics, resistance to abrasion or punctures, stain repellence, protection from spills and liquids, resistance to ultraviolet degradation, etc. The bottom layer of the sensor can be made with similar materials to serve functions similar to the top layer, except that decorative or informative graphics are typically not included.

For the capacitive sensor 62, the capacitance meter 14 is connected to the conductive reference layer 8, the second conductive reference layer 66 and each trace 12. The conductive reference layer 8 is at a first voltage, the trace 12 is at a second voltage, and the second reference layer 66 is at a third voltage, where the first and second voltages have a difference of at least 0.1 volts and the second and third voltages have a difference of at least 0.1 volts. In one embodiment, the first and second voltages have a difference of at least 1.0 volts and the second and third voltages have a difference of at least 1.0 volts. Preferably, the first and third voltages are equal. In one embodiment, the first and third voltages form the reference voltage and are held constant during the operation of the capacitive sensor. In one embodiment, the reference voltage is held equal to earth ground or the ground of the sensor environment. This will serve to best isolate the capacitive sensor from external interference and electrical discharges.

The first conductive reference layer 8 and the second conductive reference layer 66 each combine with the detector and trace layer 4 to form two separate capacitors. Preferably, the first and third voltages on each of the conductive reference layers are equal so that the two separate capacitors are electrically parallel. This simplifies the requirements of the meter 14, which can treat the two separate capacitors as a single capacitor of larger capacitance. Larger capacitance will also typically improve the sensitivity of the sensor, which is one advantage of including conductive reference layers on both sides of the detector and trace layer 4. The second electrically conductive reference layer 66 also helps shield the sensor from interference in the same manner as the first electrically conductive reference layer 8.

If the first electrically conductive reference layer 8 has a hole over each of the detectors in the detector and trace layer 4 and the dielectric 6 is not compressible and resilient, then the second electrically conductive reference layer 66 will act primarily to help shield the sensor from interference.

In the case of a sensor built with a compressible dielectric, capacitance of the sensor varies inversely with the compression of dielectric layer 6. A force applied to detector 10 will compress dielectric layer 6 thus increasing the capacitance between detector and trace layer 4 and electrically conductive reference layer 8. When the force is removed, or merely lessened, the separation distance between detector and trace layer 4 and conductive reference layer 8 increases and the capacitance of capacitive sensor 2 decreases.

In the case where the dielectric is not compressible but there is a hole in the conductive reference layer 4 that overlaps the detector 10 in the detector and trace layer 4, the capacitance increases with the approach of a capacitive body such as a person's finger. In both cases, the change in capacitance can be monitored by the meter 14, which can subsequently initiate a desired response, such as activation of an electrical device such as a radio.

To monitor the change in capacitance, preferably, a first voltage is applied to the conductive reference layer 8 and a second voltage is applied to the trace 12. In the case that there is more than one trace on the detector and trace layer 4, then each trace would get a separate voltage (ex. second, third, forth, fifth, etc. voltage). In the case where there is more than one trace, preferably the voltages are applied to the traces sequentially. In one embodiment, the voltages are applied sequentially and are substantially equal. Preferably, the voltages applied to the conductive reference layer are at least 0.1 volts different than the voltages applied to the trace(s), or in another embodiment, more than 1 volt different.

At the edge of the detector and trace layer 4, a penetration connector (not shown) is used to make electrical contact with traces 12. The principle of operation of penetration connectors is well known in electronics. When making electrical connection with electrical conductors coated with insulation, penetration connectors are used to "bite" through the insulation to the conductor inside. Penetration connector will have teeth, which are applied to the trace 12 and to the conductive reference layer 8, and potentially to the conductive reference layer 66 if one exists. In one embodiment, the traces extend past the other layers to be connected to more easily. In another embodiment of the present invention having a plurality of detectors 10 and traces 12, separate teeth in the connector can contact each of the separate traces so that the meter 14 can be used to sense changes in capacitances as pressure is applied to each detector or multiple detectors. The use of penetration connector simplifies manufacture on a large scale.

The penetration connector allows connection of the present flexible capacitive sensor 2 to the capacitance meter 14 by connecting the meter 14 to the trace 12 and the meter 14 to the conductive reference layer 8. The capacitance meter 14 measures the voltage across dielectric layer 6 from detector 10 to the conductive reference layer 8 and compares that voltage to a reference voltage. If the capacitance across the dielectric layer 6 at detector 10 changes, the voltage across detector 10 also changes, and a voltage output signal is generated based on the difference between the reference voltage and the nominal voltage across detector 10. As the force applied to detector 10 is reduced, and dielectric layer 6 expands to its original dimensions, capacitance decreases.

The capacitance of detectors in this arrangement can be measured by a variety of electrical methods, two of which will be discussed here. The electrical measurements make use of the fact that the resistance of the traces does not change, only the capacitance of individual detectors. Thus, the measurable RC time constant characteristic of each detector and trace combination changes only due to changes in capacitance of the detector. One method is a voltage shift method; the other is a phase shift in the frequency response.

In the first method, which we will refer to as the voltage shift method, we use a series resistor connected to the trace. The capacitance meter 14 looks for any one of the following: (1) the time to obtain a set decline in the voltage of the trace and detector during discharge of detector 10; (2) the decline in the voltage of the trace and detector during a set time from the beginning of the discharge of detector 10; (3) the time to obtain a set increase in the voltage of the trace and detector during the charging of detector 10; or (4) the increase in the voltage of the trace and detector during a set time from the beginning of the charge of detector 10. Any one of these four quantities allows determination of the RC time constant, and hence a measurement of the change in capacitance of the detector.

In the phase shift method, a time-varying voltage signal is applied to the detector and trace layer 4. A resistor to ground is connected to the conductive reference layer 8. The resistor is used to measure the phase shift between the applied signal and the lagging signal through the detector and trace layer 4. As the lag is caused by the presence of capacitance in the detector and trace layer 4, a change in the lag can be used to determine the change in capacitance. The amplitudes of the original and lagging signal can be compared to yield more information about the state of the system. As is known in the art, common forms of the voltage signal include impulses, sine waves, and square waves. Preferably alternating voltage signals will have a frequency greater than 10 kHz.

The digital information, the decay time constant or the phase shift, represents the continuous time variation of the resistive-capacitive properties of the network and, as such, the conditions of detector 10. To achieve a better signal-to-noise ratio, averaging and filtering may be applied to the continuous data stream.

The time constant method and the phase shifts are prone to electromagnetic interference as well as stray capacitance. Thus, the noise content of the signals can obscure true conditions. Sampling is performed intervals defined by settable interrupts in microcontroller. Through sampling dictated by the Nyquist criterion, which governs sampling theory and digital reconstruction of high-frequency events, events happening at less than half the sampling frequency can be successfully captured. At the time of individual sampling, multiple samples on the order of a few microseconds each are averaged together to reduce the error introduced by the analog-to-digital converter as well as small electromagnetic effects. Sampling may occur at regular time intervals, or it may be advantageous to sample at random intervals so that the noise spectrum is not well correlated with the sampling interval.

The sampled data are then passed into either finite impulse response filters or infinite impulse response filters. These filters further reduce the effects of noise and interference on the sampled data from sources such as power lines. In this manner, a better estimate of the capacitance of the detector can be determined through a better estimate of the phase shift or time constant.

Cascading different filters permits different interpretations of the data. For example, a set of filters is used to remove or ignore long term changes to the system (e.g., gradual loss of resilience in the dielectric layer 6), thus providing a stable baseline, while other filters isolate the short term changes (i.e., pressing detector 10). The selection of different filters is a significant improvement over simple sampling and comparison to a threshold.

The capacitive sensor 14 requires calibration. Calibration is needed because baseline capacitance tends to drift over time because of environmental changes, material changes, and external electromagnetic fields. Particularly in dielectric materials made of foam, notwithstanding the use of foams with minimized creep and hysteresis, capacitance nonetheless will change in time. A sensor that can be recalibrated will always be more robust and sensitive than one that cannot be.

There are three ways to calibrate sensor 14. The first way is to program calibration settings at the time of manufacture. A second method is to calibrate sensor 14 every time the system of which it is a part initializes itself, that is, upon start up. This method effectively reduces errors for some variations on large time scales. In the third method, the sensor 14 is continuously calibrated for changing conditions by filtering out extraneous electrical noise as well as disregarding the inadvertent touch or other contact. There are commercially available electronic modules that are designed to sense capacitance and that incorporate continuous self-calibration, noise filtering and recalibration.

EXAMPLES

Example 1

A switch panel was made by laminating together multiple layers as shown in FIG. 5. All percentages are by weight unless otherwise specified.

Two identical resilient structures were made, consisting, in order, of:

I) a protective layer 104 of 100 g/m² CelFil 100 spunbonded polyester nonwoven fabric from Polymeross y Derivados of Mexico, II) a $1^{st}$ conductive layer 101 of 100 micron thick Velostat 1704 conductive film from 3M Corporation of St. Paul, Minn., and III) a resilient separating layer 102 of 8 mil thick Duraflex PT9300 polyurethane film from Deerfield Urethane of Massachusetts. The $1^{st}$ conductive layer 101 was used as a ground plane to shield the device from outside interference.

Next a $2^{nd}$ conductive layer 108 was made starting with the same nonwoven fabric as in protective layer 104. This was coated with a conductive paste consisting of a mixture of 60% Hycar 26-1199 binder from Noveon of Gastonia N.C., 10% SFG-15 graphite from Timcal of Bodio, Switzerland and 30% water. To make the paste, the graphite was added to the water along with a approximately 10 mL of SL 6227 dispersant from Milliken Chemical of Spartanburg, S.C., while stirring. Next the Hycar binder was added. Finally, Acrysol RM-8W thickener from Rohm and Haas of Philadelphia, Pa. was added until the viscosity reached 12,000 cP as measured on a Brookfield viscometer.

This paste was screen printed onto the polyester nonwoven fabric to create the patterned structure shown in FIG. 6. Detector areas 120, traces 122, pin connections 124, and reference layer connections 126 were printed. After printing, the fabric was dried in a forced-air oven for 15 minutes, to drive off the water and bind the coating to the fabric. Next, the conductive coating was painted with PE-001 silver paste from Acheson Colloids of Port Huron, Mich. and placed back in the oven to dry. The female half of a penetrating pin connector (not shown) was attached, such that separate pins pierced the traces from the each of the detectors.

This printed sheet was placed between the two identical resilient structures, such that the nonwoven protective layers 104 were on the outside of the resulting structure. Separate insulated copper wires were attached to each conductive film to connect them to the ground connections in the print. Adjacent layers were adhered together using Super 77 spray adhesive from the 3M Corporation of St. Paul, Minn.

The pin connector was attached to its male counterpart, which in turn was attached to a shielded coaxial cable such that the ground sheath of the cable was connected to the 1$^{st}$ conductive layers. The center conductor was connected sequentially to each of the traces. The other end of the coaxial cable was inserted into the capacitance measurement slots of a Triplett 2102 multimeter, which was set to measure small capacitance. The capacitance between each trace and the reference layers was measured twice, first in the quiescent state, and then while pushing on the detector so as to maximally compress the resilient separating layer.

Example 2

A second structure was made, identical to that in Example 1 except that the polymer in the resilient separating layer 102 was replaced with 3 mil thick M823 silicone film from Specialty Silicone Products of Ballston Spa, New York.

Example 3

A second structure was made, identical to that in Example 1 except that the polymer in the resilient separating layer 102 was replaced with 44 mil thick T-1505 HypurCEL polyurethane foam from Rubberlite Incorporated of Huntington, W. Va.

Table A shows the measured capacitances of each of the samples in Examples 1–3. These values are after subtracting out the 44 pF of capacitance between the cables leading from the panels to the multimeter. The pattern of the printed detector and trace elements is shown in FIG. 6. Detectors 120 were connected with the edge of the device buy the long trace 122 and the short trace 121. Also printed were the ground connections 126 and the pin connections 124.

TABLE A

| Sample | Long trace (pF) 122 | | Short trace (pF) 121 | |
|---|---|---|---|---|
| | Quiescent | Pressed | Quiescent | Pressed |
| Example 1 | 76 | 84 | 34 | 40 |
| Example 2 | 70 | 83 | 41 | 56 |
| Example 3 | 29 | 39 | 14 | 24 |

Table A shows that a thinner dielectric will give a larger capacitance, but that a thicker dielectric may give a larger relative change in capacitance (relative to the quiescent value). Which is preferable depends on the application environment, desired sensitivity, and resolution of the detecting electronics.

It is intended that the scope of the present invention include all modifications that incorporate its principal design features, and that the scope and limitations of the present invention are to be determined by the scope of the appended claims and their equivalents. It also should be understood, therefore, that the inventive concepts herein described are interchangeable and/or they can be used together in still other permutations of the present invention, and that other modifications and substitutions will be apparent to those skilled in the art from the foregoing description of the preferred embodiments without departing from the spirit or scope of the present invention.

What is claimed is:

1. A capacitive sensor comprising:
 a first flexible, resilient dielectric layer having a first and second side and a thickness of between 8 and 250 micrometers;
 an electrically conductive detector and trace layer on the first side of the first dielectric layer comprising a detector and trace;
 a first electrically conductive reference layer on a second side of the first dielectric layer;
 an electric field across the first flexible, resilient dielectric layer; and
 a capacitance meter electrically connected to the detector and trace layer and to the first conductive reference layer;
 wherein the first conductive reference layer has a first voltage and the detector and trace layer has a second voltage, and wherein the first and second voltage have a difference of at least 0.1 volts; and
 wherein the first dielectric layer comprises a film free of voids.

2. The capacitive sensor of claim 1, wherein the first dielectric layer compresses by 50% when a load of between 50 and 150 bars is applied.

3. The capacitive sensor of claim 1, wherein the electrically conductive detector and trace layer comprises 2 or more individually electrically addressed detectors and traces.

4. The capacitive sensor of claim 3, wherein the capacitance meter is electrically connected to each trace and to the first conductive reference layer, wherein the first conductive reference layer has a first voltage and each of the traces have a second voltage.

5. The capacitive sensor of claim 1, wherein the electrically conductive detector and trace layer comprises fabric printed with a conductive ink.

6. The capacitive sensor of claim 1, wherein the electrically conductive reference layer comprises an electrically conductive coating on the first dielectric layer.

7. The capacitive sensor of claim 1, further comprising:
 a second flexible, resilient dielectric layer on the electrically conductive detector and trace layer on the side opposite the first flexible, resilient dielectric layer;
 a second electrically conductive reference layer on the second flexible, resilient dielectric layer on the side opposite the electrically conductive detector and trace layer; and,
 the capacitance meter additionally electrically connected to the second conductive reference layer.

8. The capacitive sensor of claim 7, wherein the second reference layer has a third voltage, and the second and third voltages have a difference of at least 0.1 volts.

9. The capacitive sensor of claim 8, wherein the first voltage and the third voltages are equal.

* * * * *